United States Patent
Yoko et al.

(10) Patent No.: US 8,134,405 B2
(45) Date of Patent: Mar. 13, 2012

(54) SEMICONDUCTOR DEVICE AND TIMING CONTROL METHOD FOR THE SAME

(75) Inventors: Hideyuki Yoko, Tokyo (JP); Ryuuji Takishita, Fukuoka (JP)

(73) Assignee: Elpida Memory, Inc., Tokyo (JP)

( * ) Notice: Subject to any disclaimer, the term of this patent is extended or adjusted under 35 U.S.C. 154(b) by 96 days.

(21) Appl. No.: 12/257,758

(22) Filed: Oct. 24, 2008

(65) Prior Publication Data

US 2009/0108897 A1 Apr. 30, 2009

(30) Foreign Application Priority Data

Oct. 26, 2007 (JP) .................................. 2007-279520

(51) Int. Cl.
*G05F 1/10* (2006.01)
*G05F 3/02* (2006.01)

(52) U.S. Cl. ...................................................... 327/544
(58) Field of Classification Search .......... 327/544–546; 326/33, 93
See application file for complete search history.

(56) References Cited

U.S. PATENT DOCUMENTS

| | | | | |
|---|---|---|---|---|
| 5,381,455 A * | 1/1995 | Ovens et al. | ..................... | 377/67 |
| 5,926,430 A * | 7/1999 | Noda et al. | ..................... | 365/226 |
| 6,876,252 B2 * | 4/2005 | Kim et al. | ..................... | 327/544 |
| 6,917,232 B2 * | 7/2005 | Wyatt et al. | ..................... | 327/238 |
| 7,145,365 B2 * | 12/2006 | Kumata | ..................... | 326/93 |
| 7,400,175 B2 * | 7/2008 | Fallah et al. | ..................... | 326/93 |
| 7,463,076 B2 * | 12/2008 | Komura et al. | ..................... | 327/291 |
| 2004/0257117 A1 * | 12/2004 | Kimura | ..................... | 326/122 |
| 2005/0138507 A1 * | 6/2005 | Kurokawa | ..................... | 714/724 |
| 2005/0283696 A1 * | 12/2005 | Warren et al. | ..................... | 714/742 |
| 2006/0220722 A1 * | 10/2006 | Komura et al. | ..................... | 327/291 |
| 2007/0136627 A1 * | 6/2007 | LaBerge et al. | ..................... | 714/718 |
| 2009/0273383 A1 * | 11/2009 | Takatori et al. | ..................... | 327/218 |

FOREIGN PATENT DOCUMENTS

JP 2000-195254 A 7/2000
JP 2002-74953 A 3/2002

* cited by examiner

*Primary Examiner* — Quan Tra
(74) *Attorney, Agent, or Firm* — Sughrue Mion, PLLC

(57) ABSTRACT

A semiconductor device includes a power-supply control portion and a latch portion. The power-supply control portion supplies power to an internal circuit in response to an input signal synchronized with rising of clock. The latch portion latches the input signal in synchronization with falling of the clock and supplies the latched input signal to the internal circuit.

10 Claims, 5 Drawing Sheets

SEMICONDUCTOR DEVICE AND TIMING CONTROL METHOD FOR THE SAME

This application is based upon and claims the benefit of priority from Japanese Patent Application No. 2007-279520, filed on Oct. 26, 2007, the disclosure of which is incorporated herein in its entirety by reference.

BACKGROUND OF THE INVENTION

The present invention relates to a semiconductor device and a timing control method for the same, and in particular to a semiconductor device including an internal circuit connected to a power supply via a source transistor as well as to a timing control method for such a semiconductor device.

The recent development of semiconductor memories has decreased the operating voltage while having increased the operating frequency. In LPDDR2-SDRAMs (Low Power Double Data Rate2 Synchronous Dynamic Random Access Memories) (hereafter, referred to simply as LPDDR2), for example, the power supply voltage of a peripheral circuit is 1.2V and the operating frequency is 667 MHz.

In order to realize rapid operation, the Vt (threshold voltage) of transistors used in peripheral circuits has been lowered and, as a result, increase in off-current has become impossible to disregard. In order to solve this, a source transistor is provided between an internal circuit and a power supply so that the internal circuit is activated only when necessary. This type of technique is described for example in Japanese Laid-Open Patent Publication No. 2000-195254.

Further, a technique is also employed to activate an internal circuit in response to command signals so that the internal circuit is activated only when necessary. This type of technique is described for example in Japanese Laid-Open Patent Publication No. 2002-74953.

SUMMARY OF THE INVENTION

One of known semiconductor devices, namely a DDR2-SDRAM (hereafter, referred to simply as "DDR2") employs a method in which a source transistor is arranged between a memory control circuit and a power supply, and the source transistor is turned OFF when the memory control circuit is in the standby state to reduce off-current of the memory control circuit.

According to this method, however, the source transistor must be turned ON before a command is input to the memory control circuit. Moreover, in order to ensure stable operation of the memory control circuit, there must be a sufficient time difference (operating margin) between a switching timing of the source transistor and a command input timing.

The present inventors have recognized that the increased operation speed is a cause of difficulty in achieving a sufficient operating margin. The inventors have also recognized that the current consumption will be increased if simply the source transistor switching timing is made earlier in order to assure a sufficient operating margin.

The present invention seeks to solve one or more of the above-described problems.

In one embodiment, there is provided a semiconductor device that includes a power-supply control portion for supplying power to an internal circuit in response to an input signal synchronized with rising of clock; and a latch portion for latching the input signal in synchronization with falling of the clock to supply the input signal to the internal circuit.

According to the embodiment, a source transistor serving as the power supply control portion is turned ON in response to the rising of clock, and then a command signal as the input signal is supplied to the internal circuit in response to the falling of the clock. This assures a sufficient operating margin, and enables the semiconductor device to operate at an even higher speed. Further, the embodiment, which assures the sufficient operating margin, eliminates the need of turning the power supply control portion ON in a previous cycle. Accordingly, the current consumption can be reduced.

In another embodiment, there is provided a timing control method for a semiconductor device that including supplying power to an internal circuit in response to an input signal synchronized with rising of clock; and latching the input signal in synchronization with falling of the clock to supply the input signal to the internal circuit.

BRIEF DESCRIPTION OF THE DRAWINGS

The above features and advantages of the present invention will be more apparent from the following description of certain preferred embodiments taken in conjunction with the accompanying drawings, in which.

DESCRIPTION OF THE EXEMPLARY EMBODIMENTS

Before describing of the present invention, the prior art will be explained in detail with reference to FIGS. 1 and 2 in order to facilitate the understanding of the present invention.

Figure 1:
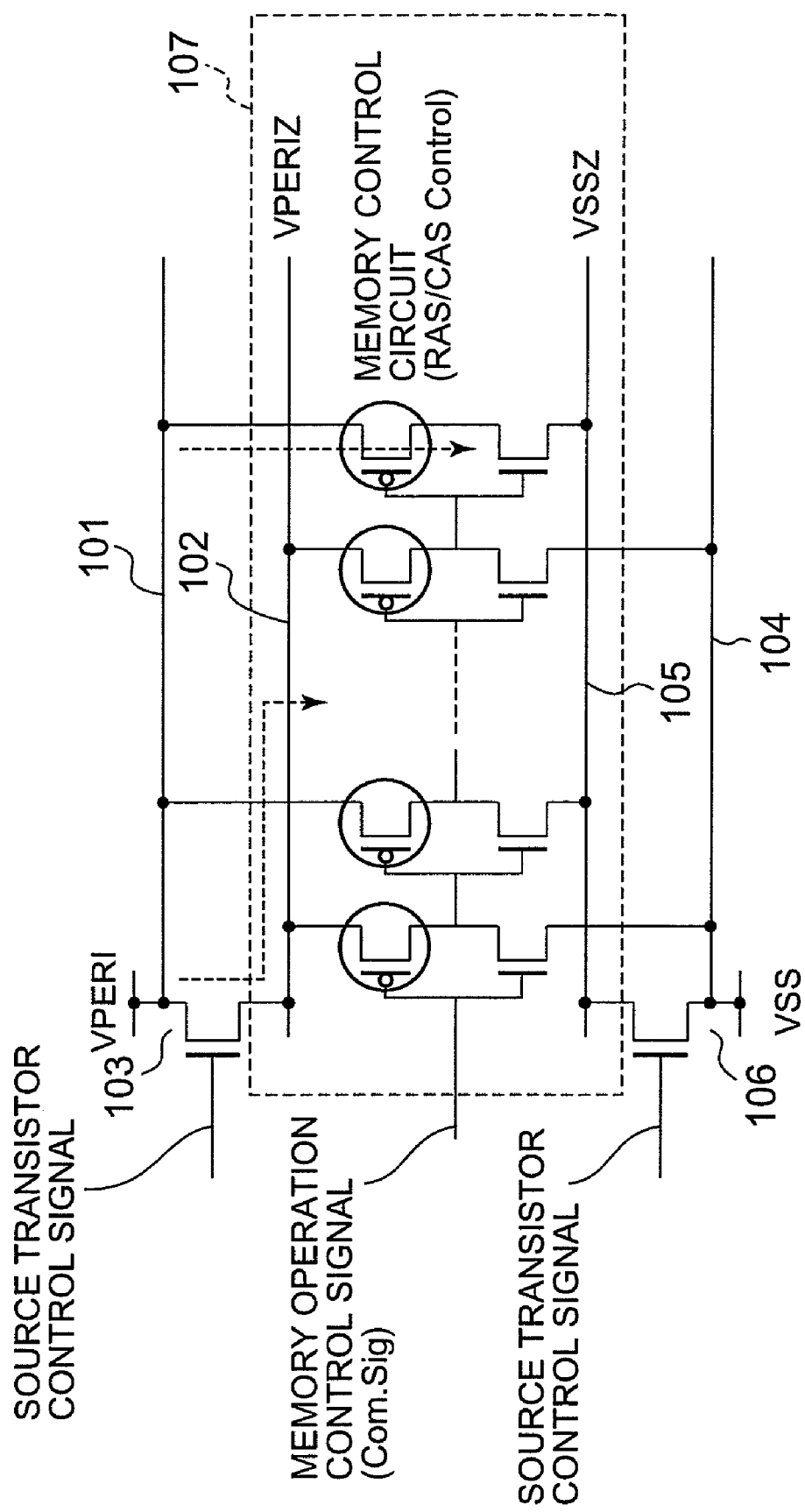
FIG. 1 is a block diagram showing a principal part of a known semiconductor device.

In a DDR2, as shown in FIG. 1, a pull-up source transistor 103 is connected between a main power-supply line 101 and an auxiliary power-supply line 102, and a pull-down source transistor 106 is connected between a main ground line 104 and an auxiliary ground line 105. This configuration is such that the source transistor is turned ON by using a source transistor control signal before inputting a memory operation control signal to a memory control circuit 107.

Figure 2:
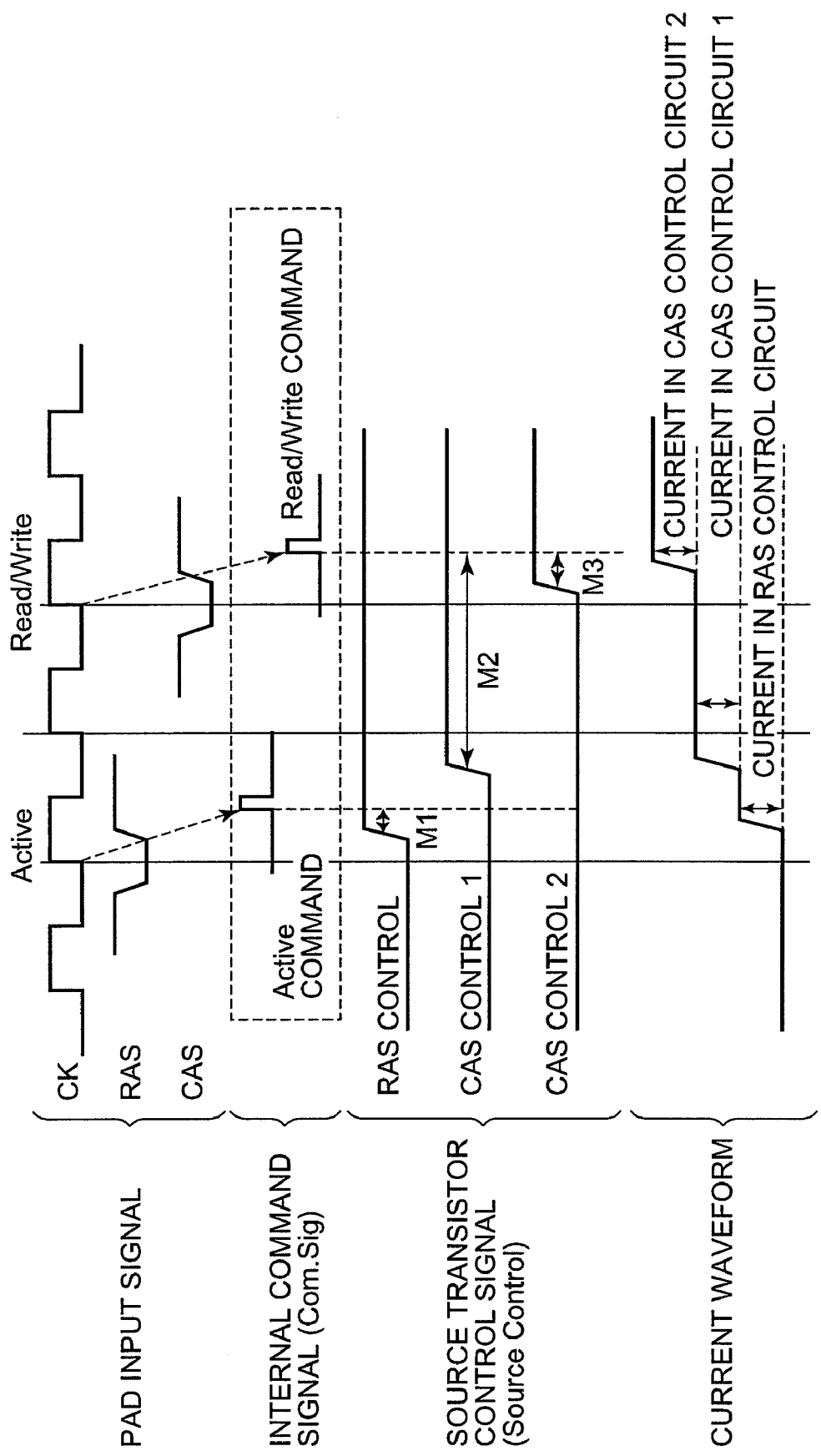
FIG. 2 is a timing chart for explaining operation of the semiconductor device shown in FIG. 1.

FIG. 2 is a timing chart showing operation timings of the DDR2. As shown in FIG. 2, if a RAS signal is at a low level at the rising timing of clock CK, an Active command is generated as an internal command signal, whereas if a CAS signal is at a low level, a Read/Write command is generated.

The Active command is supplied to a RAS control circuit. The source transistor control signal is supplied to a RAS control circuit source transistor so that the RAS control circuit source transistor is turned ON before the Active command is input to the RAS control circuit. The Read/Write command is supplied to CAS control circuits 1 and 2. A source transistor control signal is supplied to source transistors of the CAS control circuits 1 and 2 so that the source transistors of the CAS control circuits 1 and 2 are turned ON before the Read/Write command is input to the CAS control circuits 1 and 2.

In the DDR2 as described above, all the control operations are specified based on the rising of clock. This makes it impossible to provide a sufficient difference (operating margin M1, M3) between the source transistor switching timing and the command input timing. Therefore, if the clock cycle is shortened to enable the DDR2 to perform rapid operation, the internal circuit cannot be activated before input of a command signal.

Since the internal circuit cannot be activated before input of a Read/Write command, the CAS control circuit 1 is designed such that the source transistor is turned ON in response to an Active command in a previous cycle. In this case, a sufficient difference (operating margin M2) can be ensured between the source transistor switching timing and the command input timing. However, off-current will flow through the internal circuit during the period of the operating margin M2, resulting in increase of the current consumption.

As described above, no known semiconductor devices can assure a sufficient operating margin and thus it is difficult to achieve rapid operation. Further, in the case of known semiconductor devices, the attempt to assure a sufficient operating margin will increase the current consumption.

Semiconductor devices according to exemplary embodiments of the present invention will be described in detail with reference to the accompanying drawings. Description herein will be made on the assumption that the semiconductor devices are a semiconductor memory device such as a LPDDR2-SDRAM (LPDDR2) or DDR2.

Figure 3:
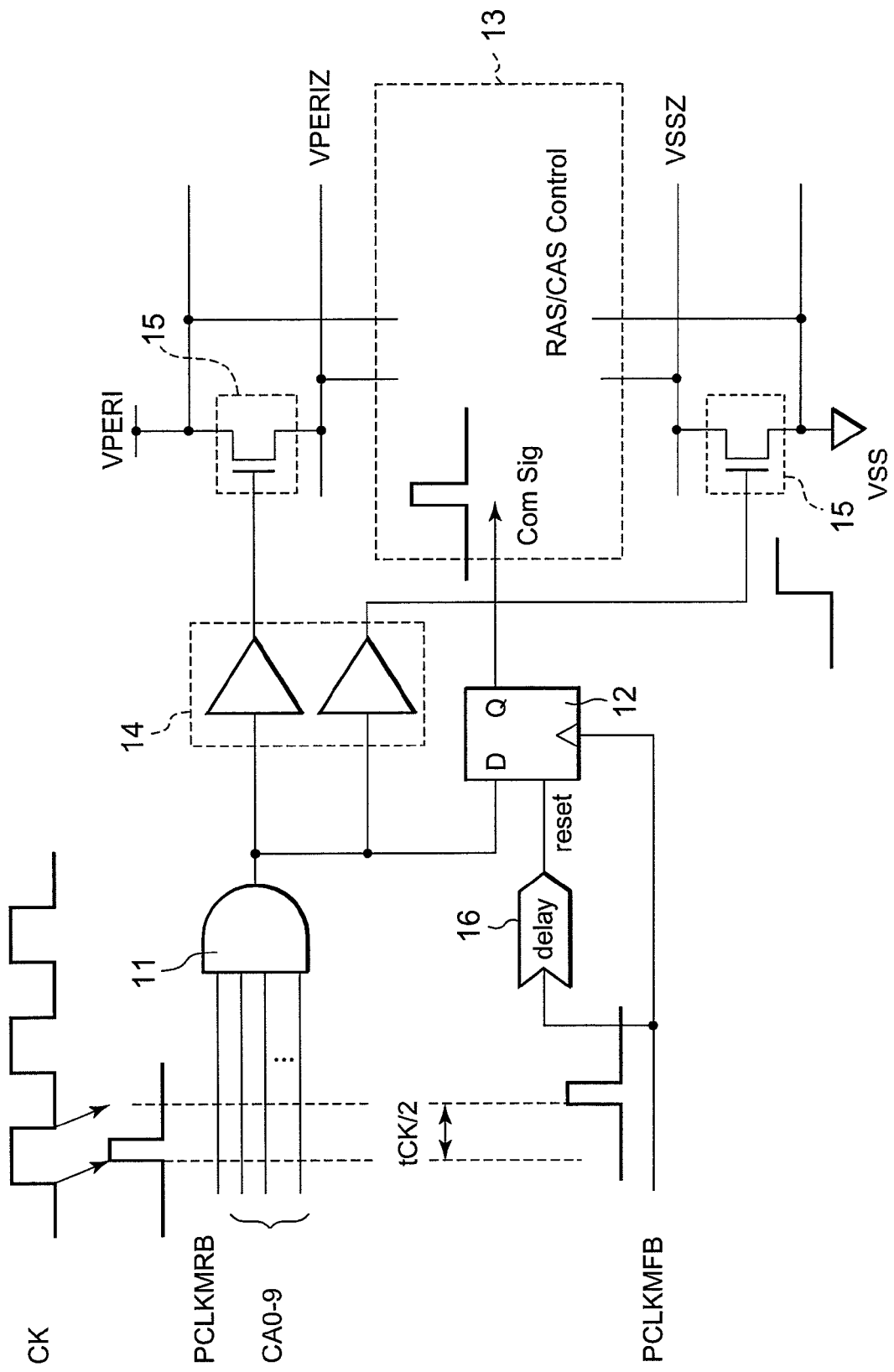
FIG. 3 is a block diagram showing a principal part of a semiconductor device according to a first embodiment of the present invention.

FIG. 3 is a block diagram showing a memory control unit and source transistor control unit of a semiconductor device according to a first embodiment of the present invention.

The memory control unit has a command decode portion (command decoder) 11, a fall command latch portion (fall command latch) 12, and a memory operation control portion (RAS/CAS control) 13.

The source transistor control unit has a driver portion (Source Tr. Driver) 14 and a source transistor portion (Source Tr) 15.

The command decode portion 11 operates as input means (or an input portion) for the memory operation control portion 13. Specifically, the command decode portion 11 decodes a memory operation control command input to command pins CA0 TO CA9 and outputs an internal command signal in synchronization with a first clock PCLKMRB.

The fall command latch portion (D latch) 12 latches the internal command signal received from the command decode portion 11 in synchronization with a second clock PCLK-MFB and supplies the latched signal to the memory operation control portion 13. This means that the fall command latch portion 12 functions as latch means (or a latch portion).

The memory operation control portion 13 performs a predetermined memory control operation (e.g., an address input) in accordance with the input internal command signal.

The driver portion 14 has a pair of drivers (pull-up and pull-down drivers) associated with a pair of source transistors forming the source transistor portion 15. These drivers drive the corresponding source transistors, respectively, in response to an internal command signal supplied by the command decode portion 11. This means that these drivers function as drive means (or drive portions).

As described above, the source transistor portion 15 is composed of a pair of source transistors. One of the source transistors (pull-up source transistor) is connected between a main power-supply line and an auxiliary power-supply line, while the other source transistor (pull-down source transistor) is connected between a main ground line and an auxiliary ground line. The main power-supply line is supplied with an external power supply voltage VPERI, and the main ground line is supplied with an external ground voltage VSS. When the source transistors are driven by the respective drivers, the auxiliary power-supply line is supplied with a power supply voltage VPERIZ and the auxiliary ground line is supplied with a ground voltage VSSZ. In this manner, the source transistors function as power supply control means (or power-supply control portions). Since these source transistors are driven by separate drivers, respectively, they may be of different characteristics from each other.

Although only one circuit group is shown for simplification in FIG. 3, this semiconductor device actually includes three circuit groups, namely RAS, first CAS, and second CAS circuit groups. Specifically, the semiconductor device has three memory operation control portions 13, and source transistor portions 15, driver portions 14, and fall command latch portions 12 corresponding to these memory operation control portions 13, respectively.

Figure 4:
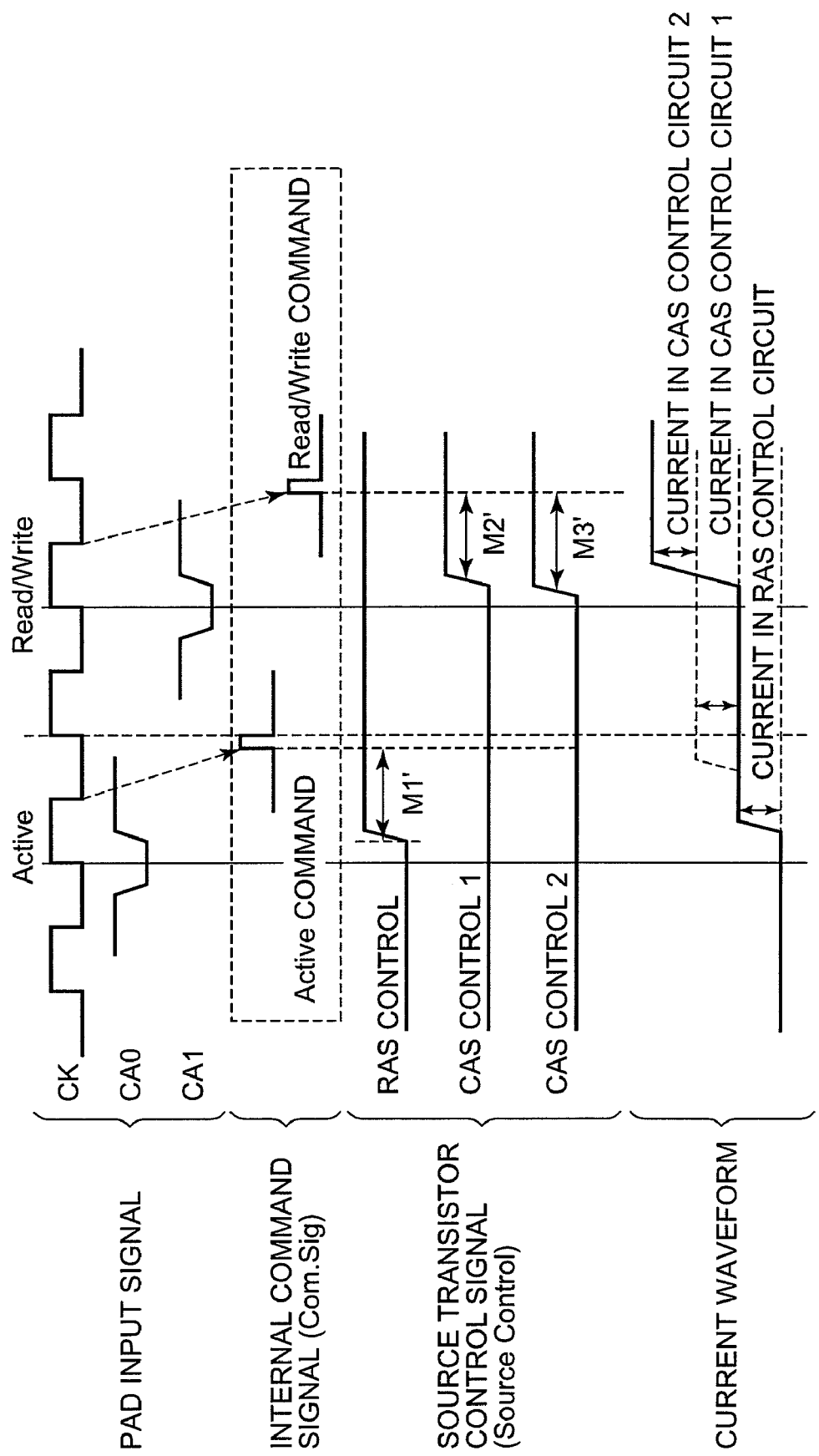
FIG. 4 is a timing chart for explaining operation of the semiconductor device shown in FIG. 3.

Operation of the semiconductor device shown in FIG. 3 will be described while additionally referring to the timing chart of FIG. 4.

Firstly, memory operation control commands are input to the command pins CA0 to CA9 in synchronization with the rising of an external clock CK. FIG. 4 only shows an Active signal to the command pins CA0 and a Read/Write signal to the CA1.

In synchronization with the rising of a first clock PCLK-MRB generated based on the rising of an external clock CK, the command decode portion 11 decodes the input memory operation control command and outputs the decoded signal as an internal command signal.

The internal command signal output by the command decode portion 11 is branched into three by branch lines (branch means) and supplied to the drivers of the driver portion 14 and to the fall command latch portion 12. As described above, this semiconductor circuit has three circuit groups in total consisting of a RAS circuit group and first and second CAS circuit groups. If the internal command signal is an Active command, it is supplied to the RAS circuit group, whereas if the internal command signal is a Read/Write command, it is supplied to the first and second CAS circuit groups.

Upon receiving the internal command signal from the command decode portion 11, the drivers of the driver portion 14 turn ON the corresponding source transistors, respectively. If the signal output by the command decode portion 11 is an Active command, the RAS source transistor is turned ON and the RAS control circuit (13) is supplied with power. If the signal output by the command decode portion 11 is a Read/Write command, the first and second CAS source transistors are turned ON and both the first and second CAS control circuits are supplied with power. Thus, according to the present embodiment, the power supply control of the memory operation control portion 13 is performed at a specified timing based on the rising of the clock CK.

On the other hand, the fall command latch portion 12 is supplied with a second clock PCLKMFB generated on the basis of the falling of the external clock CK. There is a phase difference between the first clock PCLKMRB and the second clock PCLKMFB that is equal to a half cycle of the external clock CK (tCK/2, where tCK is a cycle of the external clock).

In response to the second clock PCLKMFB, the fall command latch portion 12 latches the internal command signal received from the command decode portion 11 and outputs the latched signal to the memory operation control portion 13. After that, the fall command latch portion 12 is reset by a reset signal generated by delaying the second clock PCLKMFB by a predetermined period of time in the delay circuit 16. According to the present embodiment, as described above, the input of a command signal to the memory operation control portion 13 (i.e., a memory control operation such as address input) is performed at a specified timing based on the falling of the clock CK.

According to the configuration as described above, sufficient operating margin M1' (or M2' or M3') (=tCK/2) can be provided in a period of time from the turning ON of the source transistors of the source transistor portion 15 until the input of the internal command signal to the memory operation control portion 13. Therefore, the power supply voltages VPERIZ and VSSZ have already been stabilized when the memory operation control portion 13 starts its operation, which enables the memory operation control portion 13 to operate stably. Further, since sufficient operating margins are assured, the semiconductor device is able to operate at an even more increased speed.

Further, the provision of sufficient operating margins enables the first CAS control circuit, as well as the second CAS control circuit, to turn the source transistor ON in response to a Read/Write command. This makes it possible to reduce the current consumption in a period of time between the input of an Active command to the input of a Read/Write command.

A semiconductor device according to a second embodiment of the present invention will be described in detail with reference to FIG. 5.

Figure 5:
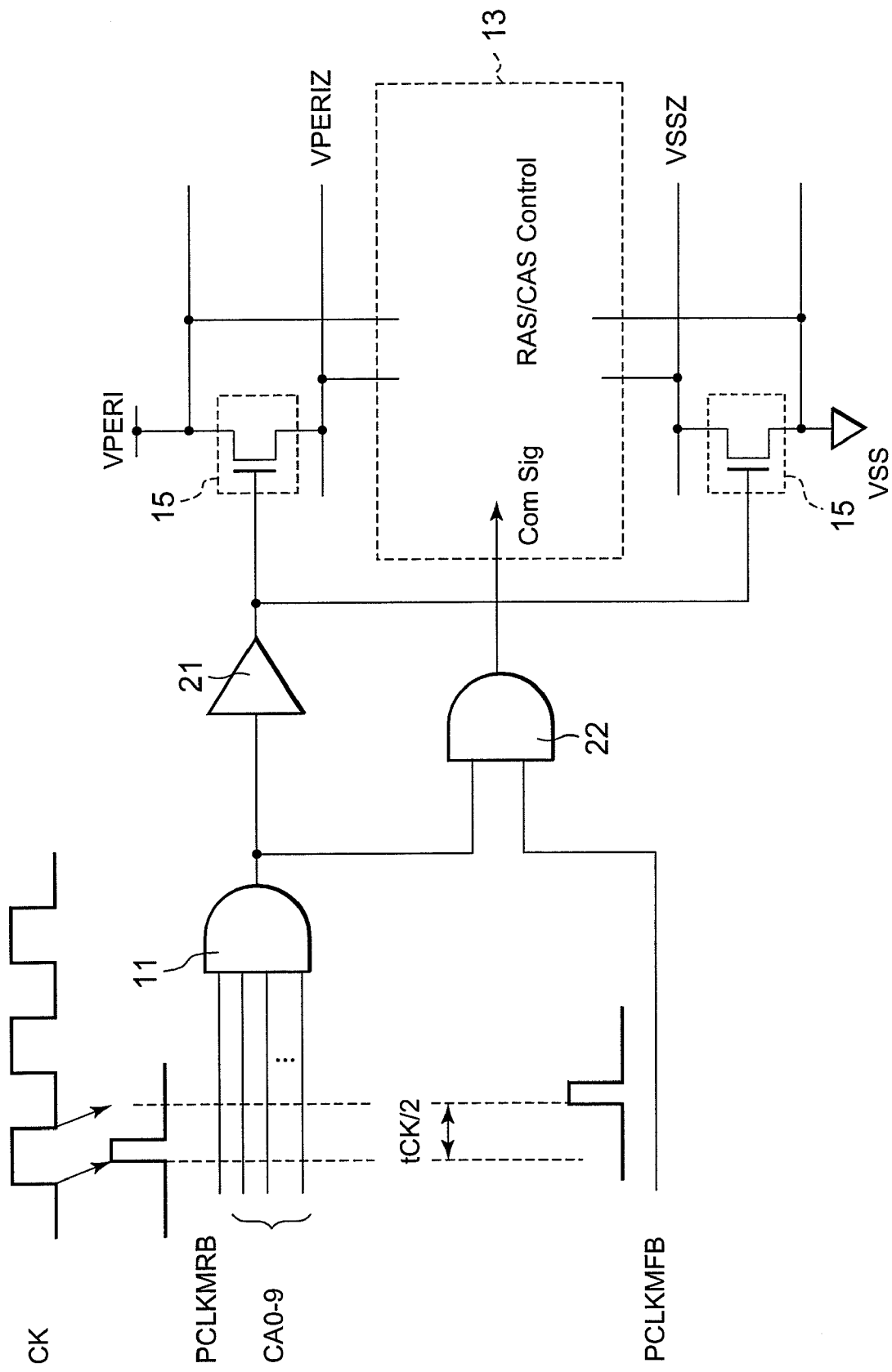
FIG. 5 is a block diagram showing a principal part of a semiconductor device according to a second embodiment of the present invention.

FIG. 5 is a block diagram showing a memory control unit and a source transistor control unit of the semiconductor device according to the second embodiment of the present invention. In FIG. 5, like components to those of FIG. 1 are given like reference characters.

In this second embodiment, a single source transistor driver 21 is provided in place of the driver portion 14 of the first embodiment. The circuit configuration can be simplified by using this single source transistor driver 21 to turn ON and OFF the pair of the source transistors of the source transistor portion 15.

In the second embodiment, a fall command decode portion 22 formed with a logic circuit as latch means is provided in place of the fall command latch portion 12. Alternatively, a through latch may be used as the latch means.

According to the second embodiment, like the first embodiment, a sufficient operating margin can be provided in a period of time from the turning ON of the source transistor until the input of an internal command signal to the memory operation control portion 13, and hence the current consumption in that period can be reduced.

The semiconductor device according to the present invention is designed, as described above, such that the internal circuit is supplied with power in response to the rising of clock, and an input signal is supplied to the internal circuit in response to the falling of the clock, whereby the operation can be stabilized and the current consumption can be reduced. Thus, both rapid operation and low current consumption can be achieved.

It is apparent that the present invention is not limited to the above embodiments, but may be modified and changed without departing from the scope and spirit of the invention.

What is claimed is:

1. A device comprising:
    a first main power supply line receiving a first power voltage;
    a first auxiliary power supply line;
    a second main power supply line receiving a second power voltage;
    a second auxiliary power supply line;
    a first transistor inserted between the first main power supply line and the first auxiliary power supply line, and connecting, when rendered conductive, the first main power supply line with the first auxiliary power supply line;
    a second transistor inserted between the second main power supply line and the second auxiliary power supply line, and connecting, when rendered conductive, the second main power supply line with the second auxiliary power supply line;
    an internal circuit coupled between the first auxiliary power supply line and the second auxiliary power supply line, and activated in response to appearance of a voltage between the first auxiliary power supply line and the second auxiliary power supply line to perform a circuit operation on an input signal supplied thereto; and
    a control circuit coupled to the first and second transistors and the internal circuit and including first, second and third circuit portions, the first circuit portion being responsive to a command signal to generate the input signal and supplying the input signal to both of the second and third circuit portions, the second circuit portion receiving the input signal and rendering the first and second transistors conductive in response to the input signal, and the third circuit portion receiving the input signal from the first circuit portion and supplying the input signal to the internal circuit after the first and second transistors have been rendered conductive,
    wherein the control circuit receives a clock, the first circuit portion of the control circuit generates the input signal in response to one of rising and falling edges of the clock, the second circuit portion of the control circuit renders the first and second transistors conductive in response to the one of rising and falling edges of the clock, and the third circuit portion of the control circuit supplies the input signal to the internal circuit in response to the other of the rising and falling edges of the clock following the one of the rising and falling edges of the clock.

2. The device as claimed in claim 1, wherein the control circuit receives a clock, the first circuit portion of the control circuit includes a decoder circuit receiving a plurality of bits as the command signal and decoding the command signal to generate the input signal in response to one of rise and fall edge of the clock signal.

3. The device as claimed in claim 1, wherein the third circuit portion of the control circuit includes a latch circuit and a delay circuit, the latch circuit includes an input terminal coupled to the first circuit portion of the control circuit, an output terminal coupled to the internal circuit, a clock terminal receiving a first timing signal generated in response to the other of the rising and falling edges of the clock following the one of the rising and falling edges of the clock and a reset terminal coupled to the delay circuit, and the delay circuit receives the first timing signal, delays the first timing signal to generate a second timing signal and supplies the second timing signal to the reset terminal of the control circuit.

4. A device comprising:
    first and second power supply lines;
    a first transistor coupled between the first and the second power supply lines, and connecting, when rendered conductive, the second power supply line with the first power supply line;
    an internal circuit coupled to at least one of the first and the second power supply lines, and receiving an input signal;
    a control circuit including first, second and third circuit portions, the first circuit portion being responsive to a command signal to generate an input signal and supplying the input signal to both of the second and third circuit portions, the second circuit portion coupled to the first transistor, receiving the input signal and supplying the input signal to the first transistor, and the third circuit portion coupled to the internal circuit, receiving the input signal, the third circuit portion supplying the input signal to the internal circuit after the first transistor has received the input signal supplied from the second circuit portion of the control circuit, wherein the control circuit receives a clock, the first circuit portion of the control circuit generates the input signal in response to one of rising and falling edges of the clock, the second circuit portion of the control circuit supplies the input signal to the first transistor in response to the one of rising and falling edges of the clock, and the third circuit portion of the control circuit supplies the input signal to the internal circuit in response to the other of the rising and falling edges of the clock following the one of the rising and falling edges of the clock.

5. The device as claimed in claim 4, wherein the control circuit receives a clock, the first circuit portion of the control circuit includes a decoder circuit receiving a plurality of bits as the command signal and decoding the command signal to generate the input signal in response to one of rise and fall edge of the clock signal.

6. The device as claimed in claim 4, wherein the third circuit portion of the control circuit includes a latch circuit and a delay circuit, the latch circuit includes an input terminal coupled to the first circuit portion of the control circuit, an output terminal coupled to the internal circuit, a clock terminal receiving a first timing signal generated in response to the other of the rising and falling edges of the clock following the one of the rising and falling edges of the clock and a reset terminal coupled to the delay circuit, and the delay circuit receives the first timing signal, delays the first timing signal to generate a second timing signal and supplies the second timing signal to the reset terminal of the control circuit.

7. A device comprising:
a first main power supply line receiving a first power voltage;
a first auxiliary power supply line;
a second main power supply line receiving a second power voltage;
a first transistor inserted between the first main power supply line and the first auxiliary power supply line, and connecting, when rendered conductive, the first main power supply line with the first auxiliary power supply line;
a control circuit including first, second and third circuit portions, the first circuit portion being responsive to a command signal to generate an input signal and supplying the input signal to both the second and third circuit portions, the second circuit portion receiving the input signal and rendering the first transistor conductive in response to the input signal, and the third circuit portion receiving at a first input node thereof the input signal from the first circuit portion and at a second input node thereof a clock and transferring the input signal to an output node thereof in response to the clock after the first transistor has been rendered conductive; and an internal circuit including a first power node coupled to the first auxiliary power supply line, a second power node coupled to the second power supply line and an input terminal coupled to the output node of the third circuit portion of the control circuit, the internal circuit being activated by the second circuit portion rendering the first transistor conductive in response to the input signal and thereafter performing a circuit operation on the input signal transferred through the input terminal from the third circuit portion, wherein the control circuit receives the clock, the first circuit portion of the control circuit generates the input signal in response to one of rising and falling edges of the clock, the second circuit portion of the control circuit renders the first transistor conductive in response to the one of rising and falling edges of the clock, and the third circuit portion of the control circuit supplies the input signal to the internal circuit in response to the other of the rising and falling edges of the clock following the one of the rising and falling edges of the clock.

8. The device as claimed in claim 7, wherein the control circuit receives the clock, the first circuit portion of the control circuit includes a decoder circuit receiving a plurality of bits of signal as the command signal and decoding the command signal to generate the input signal in response to one of rise and fall edge of the clock signal.

9. The device as claimed in claim 7, wherein the third circuit portion of the control circuit includes a latch circuit and a delay circuit, the latch circuit includes an input terminal coupled to the first circuit portion of the control circuit, an output terminal coupled to the internal circuit, a clock terminal receiving a first timing signal generated in response to the other of the rising and falling edges of the clock following the one of the rising and falling edges of the clock and a reset terminal coupled to the delay circuit, and the delay circuit receives the first timing signal, delays the first timing signal to generate a second timing signal and supplies the second timing signal to the reset terminal of the control circuit.

10. The device as claimed in claim 8, further comprising
a second main power supply line receiving a second power voltage;
a second auxiliary power supply line; and
a second transistor inserted between the second main power supply line and the second auxiliary power supply line, and connecting, when rendered conductive, the second main power supply line with the second auxiliary power supply line, and
wherein the second circuit portion of the control circuit further renders the second transistor conductive in response to the input signal and the internal circuit is further includes a second power node coupled to the second auxiliary power supply line.

* * * * *